US008859408B2

(12) United States Patent
Flachowsky et al.

(10) Patent No.: US 8,859,408 B2
(45) Date of Patent: Oct. 14, 2014

(54) STABILIZED METAL SILICIDES IN SILICON-GERMANIUM REGIONS OF TRANSISTOR ELEMENTS

(75) Inventors: Stefan Flachowsky, Dresden (DE); Clemens Fitz, Dresden (DE); Tom Herrmann, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 103 days.

(21) Appl. No.: 13/086,516

(22) Filed: Apr. 14, 2011

(65) Prior Publication Data

US 2012/0261725 A1 Oct. 18, 2012

(51) Int. Cl.
*H01L 21/425* (2006.01)
*H01L 29/66* (2006.01)
*H01L 29/165* (2006.01)
*H01L 21/285* (2006.01)
*H01L 21/265* (2006.01)
*H01L 29/78* (2006.01)

(52) U.S. Cl.
CPC ...... *H01L 29/7833* (2013.01); *H01L 29/66636* (2013.01); *H01L 29/165* (2013.01); *H01L 21/28518* (2013.01); *H01L 21/26506* (2013.01); *H01L 29/7843* (2013.01); *H01L 29/7848* (2013.01); *H01L 29/6659* (2013.01); *H01L 29/665* (2013.01)
USPC ........... 438/530; 438/306; 438/581; 438/583; 438/649; 438/651; 325/288; 325/382; 325/384; 325/E29.156; 325/E21.006

(58) Field of Classification Search
None
See application file for complete search history.

(56) References Cited

U.S. PATENT DOCUMENTS

| 5,624,896 A * | 4/1997 | Axworthy et al. ........... 514/15.2 |
| 2008/0096356 A1 * | 4/2008 | Arghavani ..................... 438/285 |
| 2011/0147809 A1 * | 6/2011 | Yang et al. ..................... 257/288 |

OTHER PUBLICATIONS

Nishiyama et al. ("A Thermally Stable Salicide Process Using N2 Implantation into TiSi2," Proceedings of IEEE 7th International Conference on VLSI Multilevel Interconnection, pp. 310-316, 1990).*
Colgan et al. ("Formation and stability of silicides on polycrystalline silicon," Materials Science and Engineering, R16, pp. 43-96).*

* cited by examiner

*Primary Examiner* — Yasser A Abdelaziez
(74) *Attorney, Agent, or Firm* — Amerson Law Firm, PLLC

(57) ABSTRACT

Generally, the present disclosure is directed to methods of stabilizing metal silicide contact regions formed in a silicon-germanium active area of a semiconductor device, and devices comprising stabilized metal silicides. One illustrative method disclosed herein includes performing an activation anneal to activate dopants implanted in an active area of a semiconductor device, wherein the active area comprises germanium. Additionally, the method includes, among other things, performing an ion implantation process to implant ions into the active area after performing the activation anneal, forming a metal silicide contact region in the active area, and forming a conductive contact element to the metal silicide contact region.

17 Claims, 6 Drawing Sheets

STABILIZED METAL SILICIDES IN SILICON-GERMANIUM REGIONS OF TRANSISTOR ELEMENTS

BACKGROUND OF THE INVENTION

1. Field of the Invention

Generally, the present invention relates to the fabrication of integrated circuits, and, more particularly, to the formation of stabilized metal silicide regions in transistor elements containing silicon-germanium material.

2. Description of the Related Art

In modern ultra-high density integrated circuits, device features have been steadily decreasing in size to enhance the performance of the semiconductor device and the overall functionality of the circuit. However, commensurate with the on-going shrinkage of feature sizes, certain size-related problems arise that may at least partially offset the advantages that may be obtained by simple size reduction alone. Generally speaking, decreasing the size of, for instance, circuit elements such as MOS transistors and the like, may lead to superior performance characteristics due to a decreased channel length of the transistor element, thereby resulting in higher drive current capabilities and enhanced switching speeds. Upon decreasing the channel length of transistor elements, however, the electrical resistance of conductive lines and contact regions—e.g., those regions that provide electrical contact to the transistor elements—becomes a significant issue in the overall transistor design, since the cross-sectional area of these lines and regions is similarly decreased. However, the cross-sectional area of the conductive lines and contact regions, together with the characteristics of the materials they comprise, may have a significant influence on the effective electrical resistance of these circuit elements.

Furthermore, as integrated circuits become smaller and more closely spaced—i.e., as the number of circuit elements that are packed within a given unit area of a semiconductor device substrate increases—greater the number of interconnections that are required between these circuit elements. Moreover, it is not uncommon for the number of required interconnects to increase in a non-linear fashion relative to the number of circuit elements, such that the amount of "real estate" available for interconnects becomes even further limited, thus increasing the likelihood that the cross-sectional area of critical conductive elements might be further reduced.

Presently, the majority of integrated circuits are silicon-based, that is, most of the circuit elements comprise silicon-containing regions which act as conductive areas. These silicon-containing regions may be in crystalline, polycrystalline and/or amorphous form, and they may be doped and/or undoped, as may be required for the specific conductivity of the specific circuit element. One illustrative example in this context is that of a gate electrode of a MOS transistor element, which may be considered as a polysilicon line. Upon application of an appropriate control voltage to the gate electrode, a conductive channel is formed proximate the interface of a thin gate insulation layer and an active area of the semiconducting substrate. Although the design step of reducing the feature size of a transistor element tends to improve device performance, due to the reduced channel length, the commensurate shrinking of the gate electrode may otherwise result in significant delays in the propagation of the signal along the channel width direction. Moreover, the issue of signal propagation delay is further exacerbated for polysilicon lines connecting to individual circuit elements or to different active areas within the device. Therefore, it is particularly important to improve the sheet resistance of polysilicon lines and other silicon-containing contact regions so as to allow further device scaling without compromising overall device performance. For this reason, and depending upon the device design requirements, it has become commonplace to reduce the sheet resistance of polysilicon lines and silicon contact regions by forming a metal silicide in and on appropriate portions of the respective silicon-containing regions.

With reference to FIGS. 1a-1e, one illustrative prior art process flow for forming a metal silicide on a corresponding portion of a representative MOS transistor element will now be described.

FIG. 1a schematically shows a cross-sectional view of an illustrative semiconductor device 100 comprising a substrate 101, in and above which an illustrative MOS transistor element 150 may be formed based on well-established semiconductor device processing techniques. The substrate 101 may represent any appropriate substrate on which may be formed a semiconductor layer 103, such as a silicon-based layer, or any other appropriate semiconductor material that facilitates the formation of the transistor element 150. It should be appreciated that the semiconductor layer 103, even if provided as a silicon-based layer, may include other materials, such as germanium, carbon and the like, in addition to an appropriate dopant species for establishing the requisite conductivity type in an active area 102 of the semiconductor layer 103. Furthermore, in some illustrative embodiments, the transistor element 150 may be formed as one of a plurality of bulk transistors, i.e., the semiconductor layer 103 may be formed on or be part of a substantially crystalline substrate material, while in other cases specific regions of the device 100, or the entire device 100, may be formed on the basis of a silicon-on-insulator (SOI) architecture, in which a buried insulating layer (not shown) may be provided below the semiconductor layer 103.

As shown in FIG. 1a, the transistor element 150 includes a gate electrode structure 120 formed above an active area 102. The active area 102 may be enclosed by an isolation structure 104, which in the present example is provided in the form of a shallow trench isolation, as may typically be used for sophisticated integrated circuits. In the illustrated embodiment, highly doped source and drain regions 106 are formed in the active area 102, along with source/drain extension regions 105 that usually comprise a dopant concentration less than that of the highly doped regions 106. The source and drain regions 106, including the extension regions 105, are laterally separated by a channel region 107. Also as shown in FIG. 1a, the gate electrode structure 120 may include a gate insulation layer 108 formed above the channel region 107, which electrically and physically isolates a gate electrode 109 from the underlying channel region 107, as well as sidewall spacer structures 110 formed adjacent to the sidewalls of the gate electrode 109.

The gate electrode structure 120 may be one of several configurations well known in the art, such as a conventional gate oxide/polysilicon gate electrode (polySiON) configuration, or a high-k dielectric/metal gate electrode (HK/MG) configuration. When a conventional polySiON configuration is contemplated, the gate insulation layer 108 may comprise a conventional gate dielectric material, such as, for example, silicon dioxide, silicon oxynitride, and the like, and the gate electrode 109 may comprise polysilicon. On the other hand, when an HK/MG configuration is used, the gate insulation layer may be one of several well-known high-k gate dielectric materials (i.e., materials having a dielectric constant "k" greater than 10), such as tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like, whereas metal gate stack comprising, for example, metal gate materials such as titanium nitride (TiN), titanium aluminum nitride (TiAlN), titanium silicon nitride (TiSiN) and the like, may be used for the gate electrode 109. Furthermore, the upper portion of the metal gate stack of an HK/MG configuration may also comprise polysilicon. Other materials and combinations may also be used.

Depending on the device requirements and/or the overall processing strategy, the sidewall spacer structures 110 may comprise one or more suitable dielectric materials, such as silicon nitride, silicon dioxide, silicon oxynitride, and the like. Furthermore, the sidewall spacer structures 110 may include two or even more spacer elements, such as offset spacers, conformal liners, and the like, which may act as appropriate implantation masks for creating the lateral dopant profile for the highly doped drain and source regions 106 and extension regions 105. The configuration shown in FIG. 1a depicts the illustrative semiconductor device 100 after dopants in the drain and source regions 106 and the extension regions 105 have been put on substitutional lattice sites by an activation annealing step.

It should be appreciated that when the transistor element 150 represents a PMOS transistor, device performance can sometimes be enhanced by inducing a compressive stress in the channel region 107 of the transistor element 150 so as to increase hole mobility. In some cases, a compressive stress may be induced in the channel region 107 by forming "embedded" stressed material regions 103a in the upper portion of the source and drain regions 106 and on either side of the channel region 107, thus leading to improvements in the overall speed and performance of the PMOS transistor element 150. In some PMOS transistor elements, the stressed material regions 103a may be created by forming cavities 103c in the active area 102 on either side of the gate electrode structure 120. Thereafter a silicon-germanium material layer may be epitaxially grown so as to completely fill, or even over-fill, the cavities 103c, thus forming embedded material regions 103a. As is known to those having skill in the art, the epitaxially grown silicon-germanium material may take on a lattice structure and crystal orientation that is substantially identical to those of the silicon material comprising the active area 102 of the semiconductor layer 103. Furthermore, since the molecules comprising a silicon-germanium material are larger than those comprising a material that is substantially silicon (as may comprise the semiconductor layer 103), the larger silicon-germanium atoms may induce a localized compressive stress on the surrounding smaller atoms of the substantially silicon material in the active area 102 of the semiconductor layer 103, thereby causing a compressive stress on the channel region 107 of the PMOS transistor element 150. After forming the silicon-germanium material regions 103a, the sidewall spacer structures 110 may be formed and dopants may be implanted in the active area 102 so as to form the extension regions 105 and deep drain and source regions 106, followed by an activation anneal as previously discussed.

FIG. 1b schematically depicts the semiconductor device 100 of FIG. 1a after a refractory metal layer 111 is formed on the transistor element 150. Depending on the overall device processing strategy, the refractory metal layer 111 may be formed using a suitable material deposition process, such as chemical vapor deposition (CVD), physical vapor deposition (PVD), and the like, and may comprise any one of a number of refractory that are used to form metal silicide contacts in the gate electrode and source/drain regions of transistor elements metals, as are well known in the art, such as nickel, titanium, cobalt, and the like. While the type of metal silicides used for a given contact region may depend on specific device requirements, nickel silicide provides some distinct advantages over cobalt and titanium silicides. For example, nickel monosilicide contacts are typically thinner than the conventional titanium or cobalt disilicide contacts, therefore less silicon base material is consumed during the silicide conversion process. Moreover, lower heat treating temperatures are typically used for forming nickel monosilicide as compared to forming cobalt or titanium disilicides, thereby necessitating a lower overall thermal budget. Therefore, for highly sophisticated transistor elements, nickel is increasingly considered as an appropriate substitute for both cobalt and titanium. Accordingly, it is therefore assumed in the following description that the refractory metal layer 111 is substantially comprised of nickel. In some embodiments, the refractory metal layer may also comprise platinum, which in some cases may promote a more homogeneous formation of nickel monosilicide.

After deposition of the refractory metal layer 111, a heat treatment process 121 may be performed so as to initiate a chemical reaction between the nickel atoms in the layer 111 and the silicon atoms in those areas of the source and drain regions 106 and the gate electrode 109 that are in contact with the nickel, thereby forming nickel silicide regions that substantially comprises low-resistivity nickel monosilicide. The heat treatment process 121 is generally a two-step process, wherein a first heat treatment step is performed in the range of approximately 300°-400° C. for a time period of approximately 30-90 seconds to primarily form nickel monosilicide, with some isolated regions of higher resistivity nickel disilicide also being present. After the first heat treatment step, any non-reacted nickel material from the refractory metal layer 111 is selectively removed by an etch/cleaning process, of which suitable recipes are well known in the art. Furthermore, in those instance where the refractory metal layer 111 also comprises platinum to facilitate silicide formation, the etch/cleaning process may include a second etch step based on, for example, aqua regia, to remove any residual platinum metal remaining on the exposed surfaces of transistor 150. Thereafter, a second heat treatment step is performed in the range of approximately 400°-500° C., again for a time period of approximately 30-90 seconds, to convert the regions of higher resistivity nickel disilicide into regions of low-resistivity nickel monosilicide. It should be noted that the silicon material contained in the sidewall spacer structures 110 and the shallow trench isolation regions 104 does not substantially take part in the chemical reaction induced during the heat treatment process 121, as it is present in those features only as a thermally stable silicon dioxide and/or silicon nitride material.

FIG. 1c schematically shows the semiconductor device 100 after the two-step heat treatment process 121 has been completed and the unreacted portions of the refractory metal layer 111 have been removed from above the transistor element 150. As illustrated in FIG. 1c, nickel silicide layers 112 have been formed in the contact region 112c at the upper surface of the source and drain regions 106, and nickel silicide layer 113 has been formed in the contact region 113c at the upper surface of the gate electrode 109. Furthermore, in the processing stage illustrated in FIG. 1c, a stressed material layer 114, having, for example, an inherent tensile stress, is formed above the semiconductor device 100 so as to enhance the performance of the transistor element 150. The stressed material layer 114 may comprise a dielectric material having an etch selectivity to an interlayer dielectric material layer 115 formed above the semiconductor device 100 during a later manufacturing stage (see, e.g., FIG. 1e). For example, the stressed material layer 114 may be a silicon nitride layer, which may be formed above the transistor element 150 using a suitably designed deposition process 122, such as a plasma-enhanced chemical vapor deposition (PECVD) process, and the like. Furthermore, the process recipe of the deposition process 122 may be adjusted as required so that the tensile stress of the as-deposited silicon nitride stressed material layer 114 is in the range of approximately 800-1200 MPa. For example, the deposition process 122 may be performed under a pressure that is in the range of 300-1200 mTorr, at a temperature between 400°-500° C.

FIG. 1d schematically illustrates the semiconductor device 100 shown in FIG. 1c in a further manufacturing stage, wherein the stressed material layer 114 is exposed to an ultraviolet light (UV) cure 123. The UV cure 123 is performed in the range of 400°-500° C., and is performed so as to increase the tensile stress of the silicon nitride stressed material layer 114 to a level greater than 1 GPa, up to as high as 2 GPa, thereby further enhancing the overall speed and performance of the transistor element 150.

As previously noted, when the transistor element 150 represents a PMOS transistor, a silicon-germanium material region 103a may be embedded in the upper portion of the drain and source regions 106 so as to induce a compressive stress in the channel region 107, thereby facilitating hole mobility and increasing device performance. However, in PMOS transistors having silicon-germanium material in the drain and source regions 106, the nickel silicide material 112 present in contact regions 112c tends to agglomerate, or cluster, under exposure to the UV cure 123, into agglomerated nickel silicide regions 112a, as schematically depicted in FIG. 1d. By contrast, nickel silicide agglomeration does not occur under exposure to the UV cure 123 in the nickel silicide layer 113 in the upper portion of the gate electrode 109, which is comprised substantially of polysilicon material. Accordingly, it is believed that nickel silicide agglomeration may possibly be caused by the presence of germanium, which may tend to "destabilize" the microstructure under exposure to UV light, thereby allowing some degree of nickel silicide and/or silicon-germanium material diffusion to occur. Moreover, it is also believed that the greater the concentration of germanium, the more "unstable" the microstructure may become. For example, the rate of material diffusion and subsequent agglomeration of nickel silicides formed in silicon-germanium materials and exposed to UV light appears to be worse in alloys having a germanium concentration of 35% by weight, as compared to a germanium concentration of 20% by weight. As depicted in FIG. 1d, this material diffusion under the UV cure 123 can lead to the spotty presence of agglomerated nickel silicide regions 112a in the contact regions 112c, which may potentially cause product defects and thereby result in reduced product yield, as will be discussed below.

After the UV cure step 123 has been completed, an interlayer dielectric material layer 115 may be formed above the semiconductor device 100, as illustrated in FIG. 1e. Thereafter, an anisotropic etch process 124, such as a reactive ion etch (RIE) process and the like, may be performed on the basis of an appropriately patterned etch mask layer 116 so as to form via openings 117 and 118 in the interlayer dielectric material layer 115. Depending on etch selectivity, the stressed material layer 114 may be used as an etch stop layer during the formation of the via openings 117 and 118. Thereafter, the etch recipe of the anisotropic etch process 124 may be adjusted so as to remove the material of the stressed material/etch stop layer 114 at the bottom of via opening 117 and 118 so as to expose the contact region 112c in the source/drain region 106 and contact region 113c in the gate electrode 109. However, as shown in FIG. 1e, due to the "spotty" nature of the agglomerated nickel silicide regions 112a, via openings 117 may only partially align with the nickel silicide material in contact regions 112c, thereby potentially leading to product defects, as illustrated in FIG. 1f and described below.

FIG. 1f illustrates a further advanced manufacturing stage of the semiconductor 100 depicted in FIG. 1e, wherein a conductive metal layer 119, such as tungsten, copper, silver, and the like, is formed above the interlayer dielectric material layer 115. As shown in FIG. 1f, the conductive metal layer 119 fills the via openings 117 and 118, thereby forming conductive contact elements 117c and 118c, respectively, that provide electrical connection betweens metallization layers (not shown) subsequently formed above the interlayer dielectric material layer 115 and the contact regions 112c and 113c of the transistor element 150. Due to the defects present in the nickel silicide layers 112—i.e., agglomerated nickel silicide regions 112a—the likelihood that a contact "punch through" 120 might occur in the contact regions 112c is substantially increased. As illustrated in FIG. 1f, a contact "punch through" 120 may occur when, during deposition of the conductive metal 119, the conductive contact elements 117c "punch through" the contact regions 112c in the areas between the agglomerated nickel silicide regions 112a, and into the highly doped source/drain regions 106. Due to the contact "punch through" 120 that may be created, a higher resistivity contact may sometimes be created, and the likelihood of contact-to-well current leakage may also increase. Furthermore, the likelihood contact element defects related to "spotty" nickel silicides might occur during device manufacture can significantly increase with more aggressively scaled device technology nodes—such as a change from 45 nm to 32 nm, or even smaller—as it becomes substantially more likely that a given contact element may align at least partially with regions between the agglomerated nickel silicides, thereby leading to "punch through" defects as previously described. As a result, reduced device reliability and/or product yield may be expected.

In view of the quality and reliability concerns cited above, it would therefore be highly desirable to eliminate or at least reduce some of the problems generally associated with forming nickel silicide contact regions in highly sophisticated integrated circuit devices, and more specifically, in PMOS transistor devices. The presently disclosed subject matter is therefore directed to methods for forming silicide regions that may reduce one or more of the problems identified herein.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to methods of stabilizing metal silicide contact regions formed in a silicon-germanium active area of a semiconductor device, and devices comprising stabilized metal silicides. One illustrative method disclosed herein includes performing an activation anneal to activate dopants implanted in an active area of a semiconductor device, wherein the active area comprises germanium. Additionally, the method includes, among other things, performing an ion implantation process to implant ions into the active area after performing the activation anneal, forming a metal silicide contact region in the active area, and forming a conductive contact element to the metal silicide contact region.

In another illustrative embodiment, a method includes forming a metal silicide layer in a contact area of a PMOS transistor element, wherein the contact area comprises germanium. Furthermore, the method also includes performing an ion implantation process to implant at least one of carbon and nitrogen ions in the contact area, and exposing the metal silicide layer to ultraviolet light.

An illustrative semiconductor device disclosed herein includes a PMOS transistor element and a silicon-germanium material region embedded in a source region and a drain region of the PMOS transistor element, the silicon-germanium material region being adapted to induce a compressive stress in a channel region of the PMOS transistor element. The semiconductor device further includes, among other things, a metal silicide contact region in at least one of the source and drain regions of the PMOS transistor element, wherein the metal silicide region comprises at least one of implanted carbon atoms and implanted nitrogen atoms.

BRIEF DESCRIPTION OF THE DRAWINGS

The disclosure may be understood by reference to the following description taken in conjunction with the accompanying drawings, in which like reference numerals identify like elements, and in which.

Figure 1A:
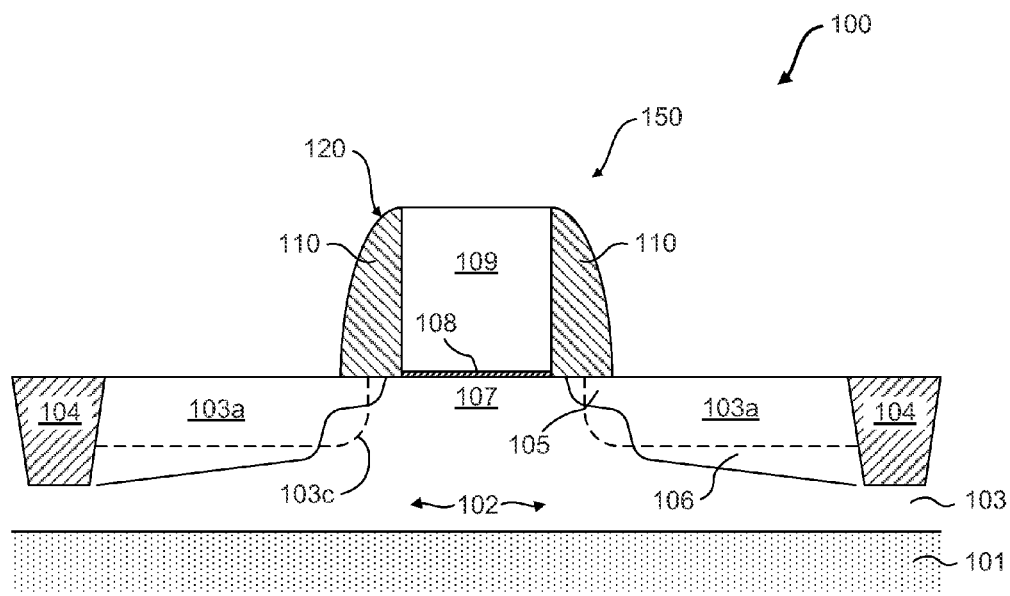
FIGS. 1a-1f schematically illustrate a process flow of one illustrative prior art method for forming metal silicide contact regions of a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
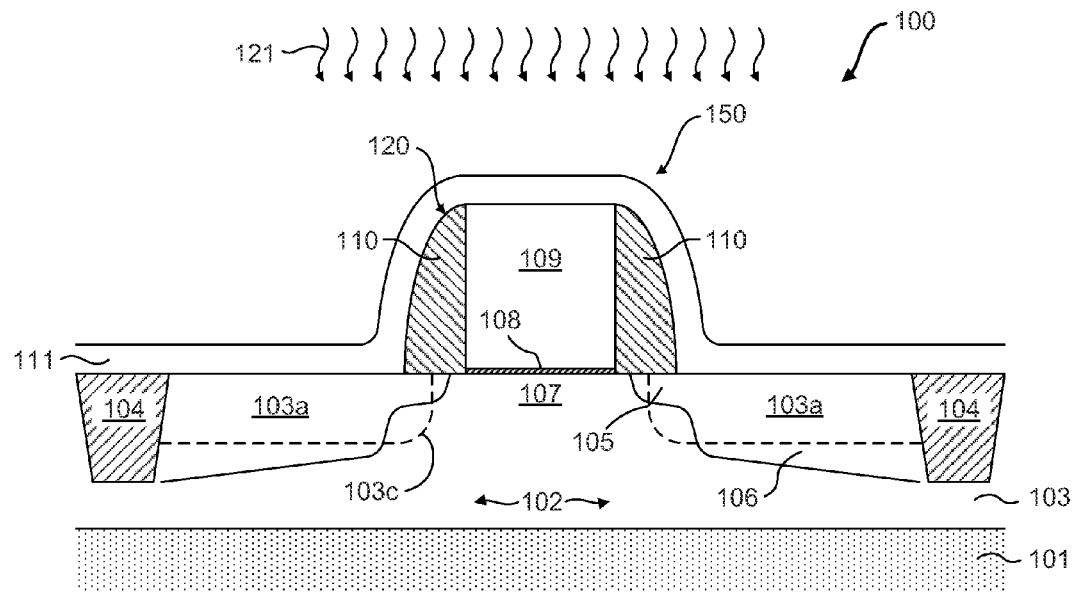
Figure 1C:
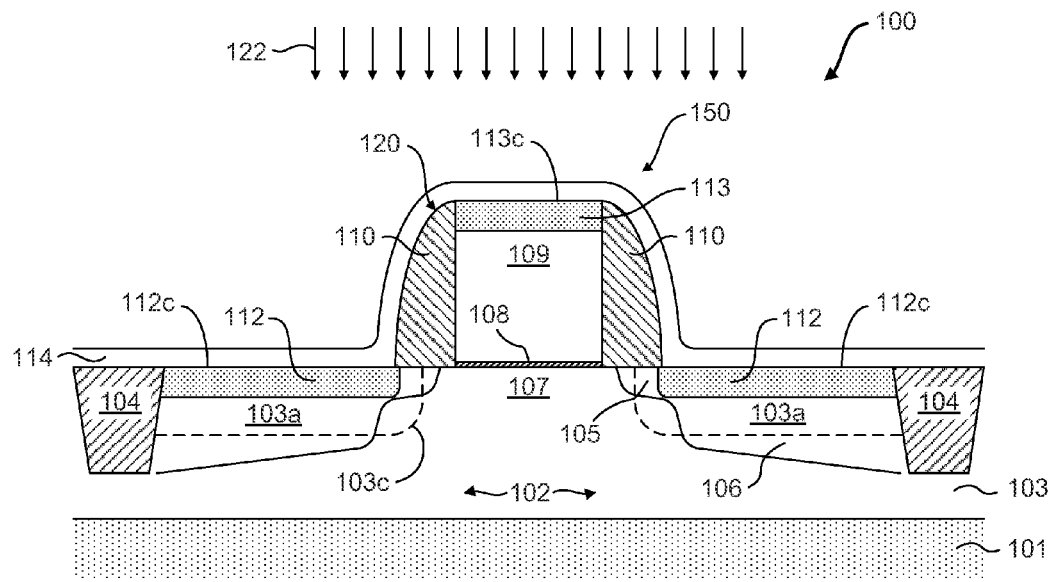
Figure 1D:
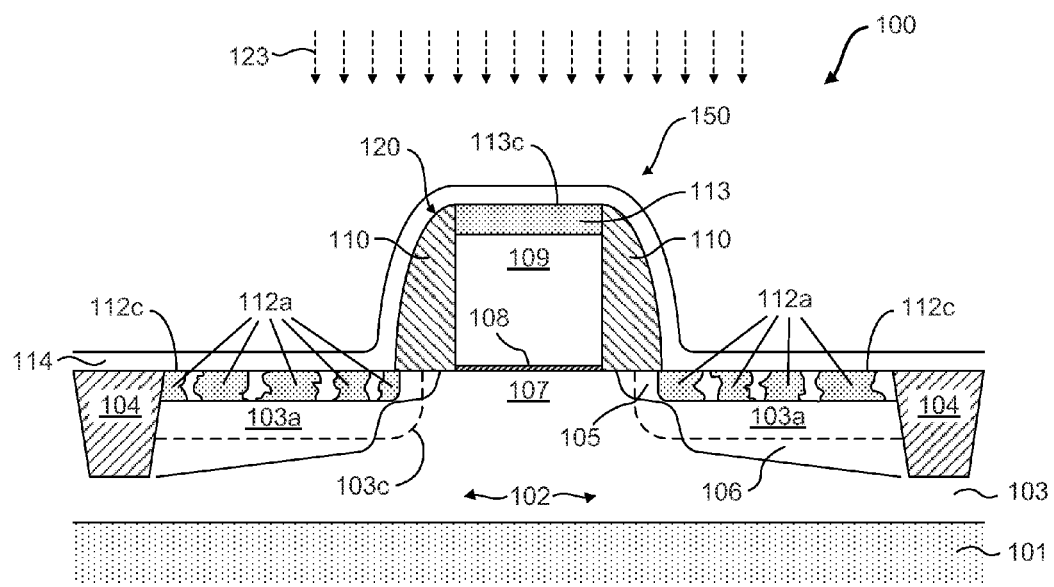
Figure 1E:
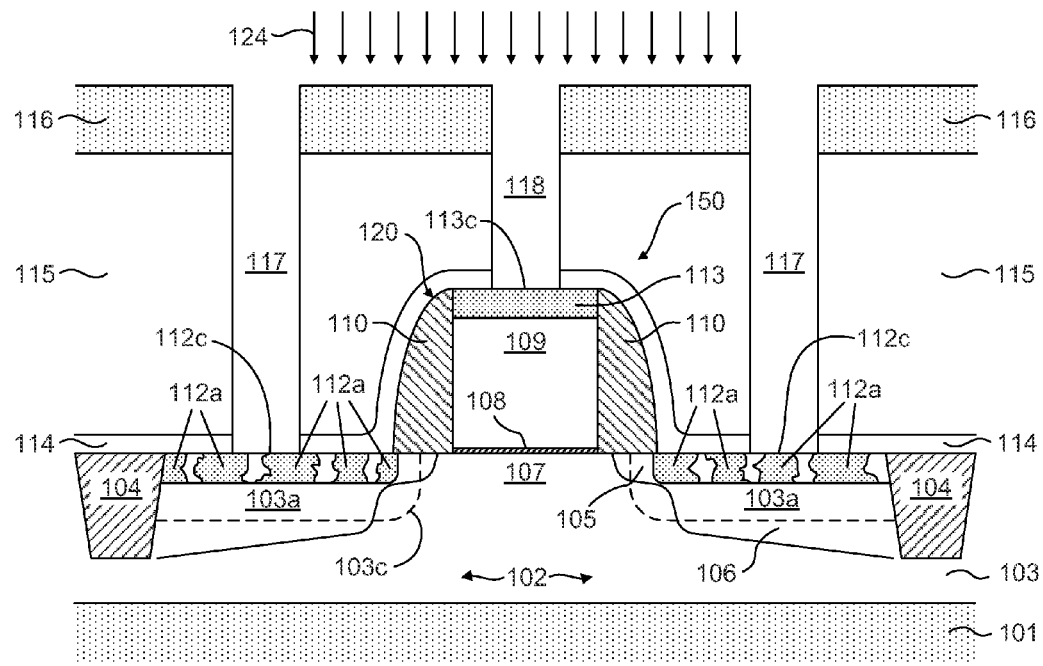
Figure 1F:
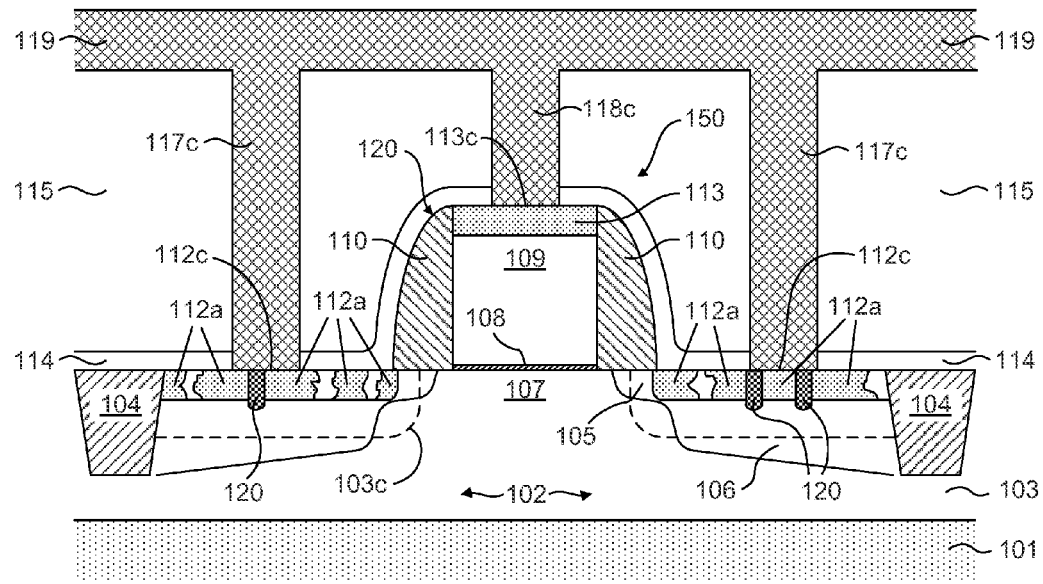
Figure 2A:
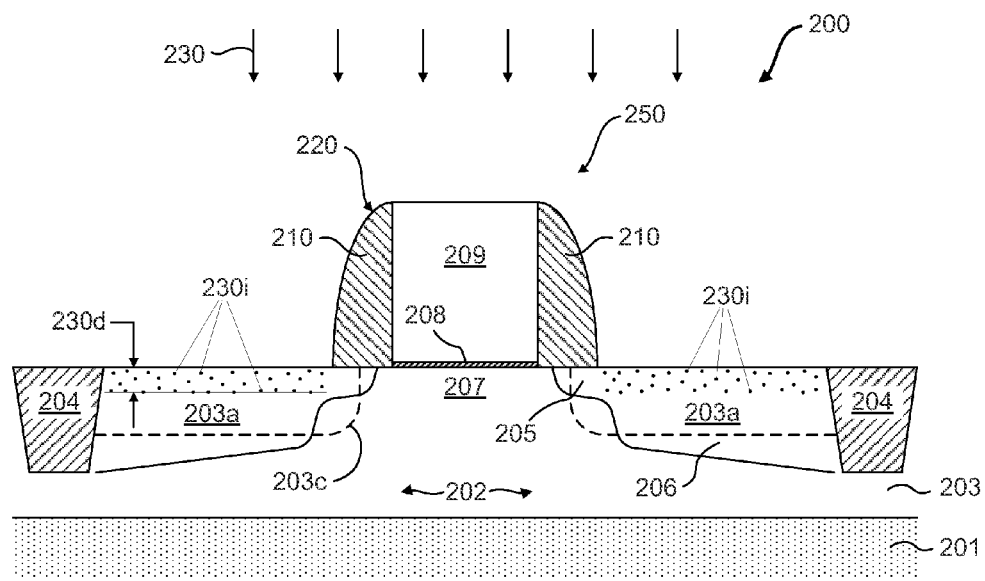
FIGS. 2a-2c schematically illustrate a process flow of one illustrative embodiment of the subject matter disclosed herein.
Figure 2B:
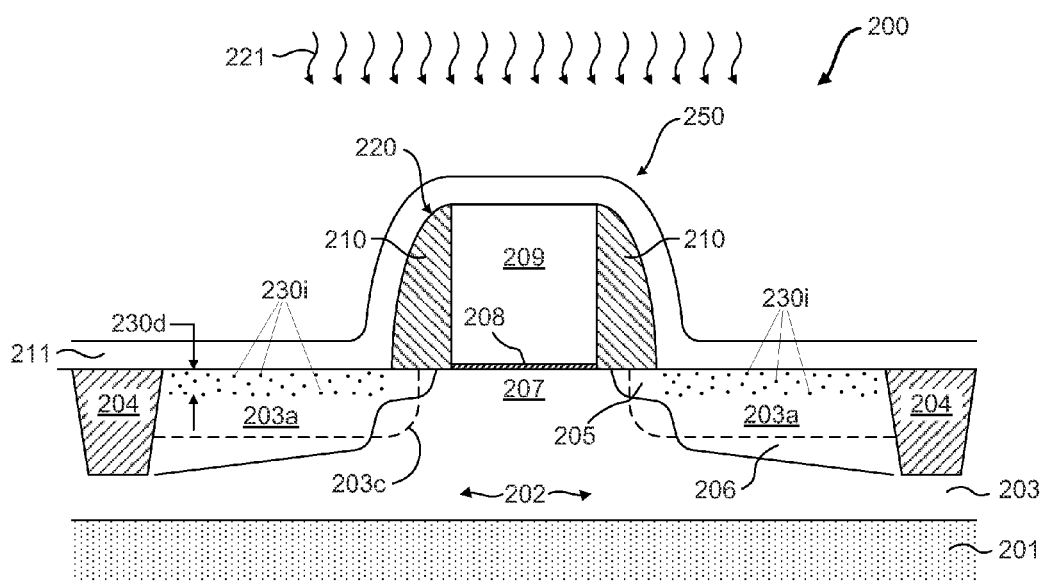
Figure 2C:
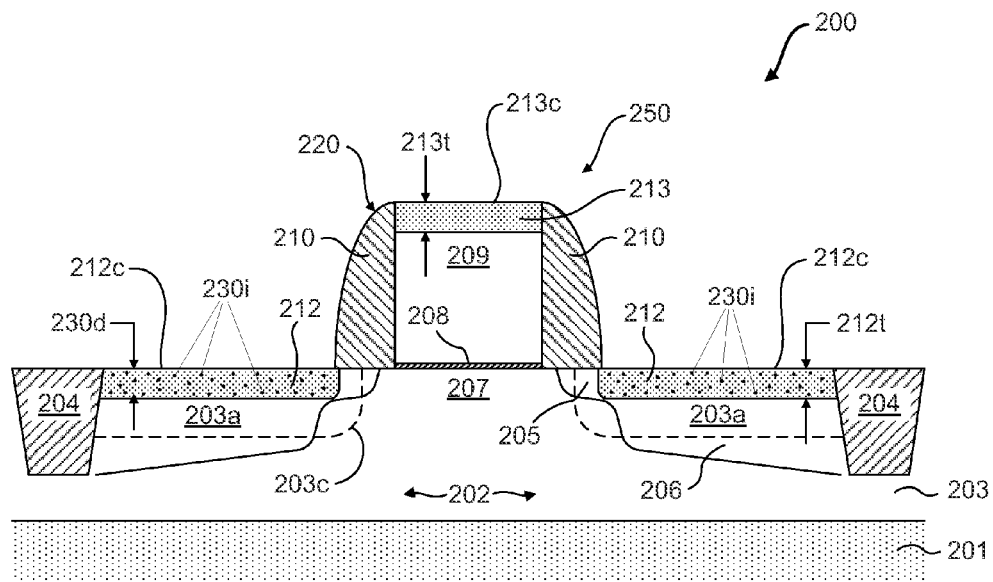
Figure 3A:
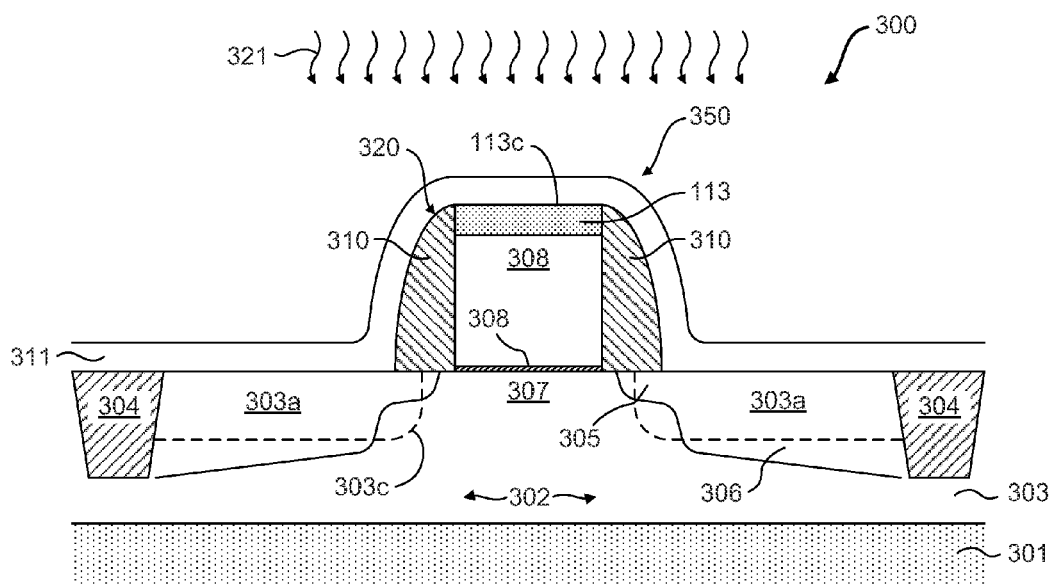
FIGS. 3a-3b schematically illustrate a process flow of another illustrative embodiment of the present disclosure.
Figure 3B:
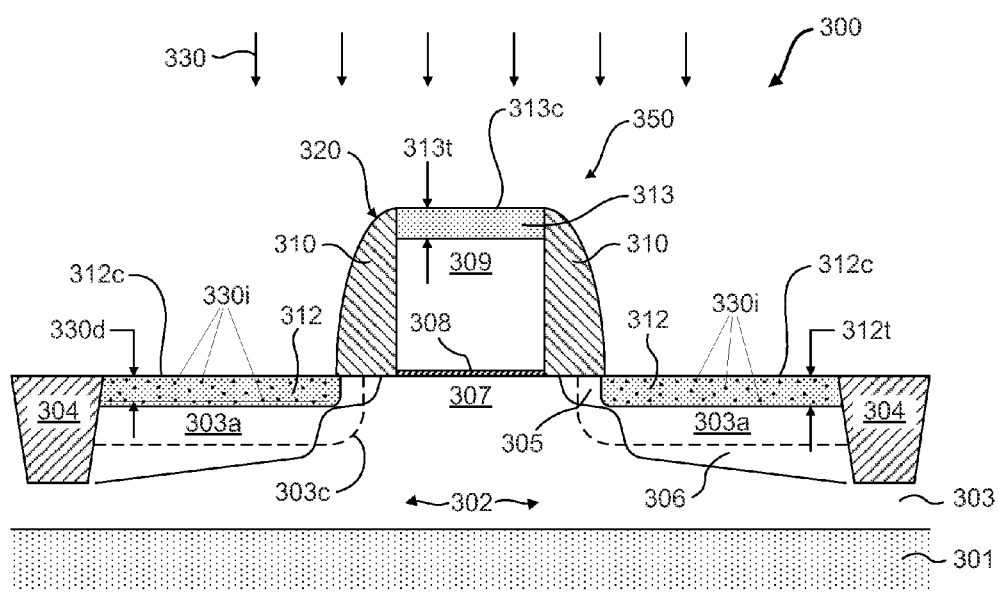

It should be noted that, where appropriate, the reference numbers used in describing the various elements illustrated in FIGS. 2a-2c and in FIGS. 3a-3b substantially correspond to the reference numbers used in describing the corresponding elements illustrated in FIG. 1a-1f above, except that the leading numeral for has been changed from a "1" to a "2," or from a "1" to a "3." For example, semiconductor device "100" corresponds to semiconductor devices "200" and "300," gate insulation layer "108" corresponds to gate insulation layers "208" and "308," gate electrode "109" corresponds to gate electrodes "209" and "309," and so on. Accordingly, the reference number designations used to identify some elements of the presently disclosed subject matter may be illustrated in the FIGS. 2a-2c and/or FIGS. 3a-3b, but may not be specifically described in the following disclosure. In those instances, it should be understood that the numbered elements shown in FIGS. 2a-2c and/or FIGS. 3a-3b which are not described in detail below substantially correspond with their like-numbered counterparts illustrated in FIG. 1a-1f, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 200 depicted in FIG. 2a, it should be understood that the gate electrode structure 220 is formed "above" the active area 202, and the substrate 201 is positioned "below" or "under" the semiconductor layer 203. Similarly, it should also be noted that sidewall spacer structures 210 are positioned "adjacent to" the sidewalls of the gate electrode 209, whereas in special cases, the spacer structures 210 may be positioned "on" the sidewalls of the gate electrode 209 in those embodiments wherein no other layers or structures are interposed therebetween.

FIG. 2a shows a schematic cross-sectional view of a semiconductor device 200, substantially corresponding to the manufacturing stage of the semiconductor device 100 illustrated in FIG. 1a and described above. The semiconductor device 200 of FIG. 2a comprises a transistor element 250 and includes a substrate 201, on which may be formed a semiconductor layer 203 comprising an active area 202 defined by an isolation structure 203, such as a shallow trench isolation. A gate electrode structure 220 may be formed above the active area 202, which may include a gate electrode 209 separated from a channel region 207 by a gate insulation layer 208, as previously described. In some illustrative embodiments, the gate electrode structure 220 may be of a conventional gate oxide/polysilicon configuration (polySiON), whereas in other embodiments the gate electrode structure may comprise high-k dielectric/metal gate configuration (HK/MG), as previously discussed with respect to the gate electrode structure 120 of FIG. 1a.

In some illustrative embodiments, the transistor element 250 may represent a PMOS transistor element having "embedded" semiconductor material regions 203a, comprising, for example, silicon-germanium, and the like, which may be epitaxially formed so as to induce a compressive stress on the channel region 207 and thereby improve overall device speed and performance, as previously discussed with respect to FIG. 1a above. Additionally, sidewall spacer structures 210 may be formed adjacent to the sidewalls of the gate electrode 209. As described with respect to transistor element 150 above, the sidewall spacer structures 210 may be comprised of, for example, silicon dioxide, silicon nitride or any other appropriate insulating material, wherein the thickness of the sidewall spacer structures 210 may be selected in accordance with the specific process requirements and design considerations of the finished semiconductor device 200, such as the desired dopant profile in the extension regions 205, and/or the drain and source regions 206.

After dopant implantation in the extension regions 205 and the drain and source regions 206 has been completed, and a subsequent activation anneal has been performed, the PMOS transistor element 250 depicted in may be subjected to an ion implantation process 230 prior to forming metal silicide contacts in the drain and source regions 206. As previously described with respect to FIG. 1d above, the presence of germanium in the metal silicide contact regions of a PMOS transistor element may cause some degree of material diffusion when the device is exposed to UV light, thereby leading to agglomerated, or clustered, metal silicide regions. It has been found, however, that implanting carbon and/or nitrogen atoms into the silicon-germanium material regions 203a after the dopant activation annealing step has been completed may tend to stabilize the microstructure, reduce material diffusion, and decrease the likelihood that the metal silicides will agglomerate when exposed to a subsequently performed UV curing step, as previously discussed above. Therefore, as shown in the illustrative embodiment depicted in FIG. 2a, the ion implantation process 230 may be performed so as to implant ions 230i into the upper portions of the silicon-germanium material regions 203a prior to depositing a layer of refractory metal and forming metal silicides in the contact regions of the PMOS transistor element 250.

Depending on the specific design and processing parameters of the PMOS transistor element 250, the ion implantation process 230 may be performed using a relatively high ion dose and a relatively low energy level so as to limit the penetration of ions 230i to a depth 203d into the active area 202. For example, in some illustrative embodiments, the ion dose used for the ion implantation process 230 may be between approximately $1 \times 10^{15}$ and $3 \times 10^{15}$ atoms/cm$^2$ and the energy level may range from approximately 1-5 keV, resulting in an ion implantation depth 203d in the range of approximately 10-40 nm, which may in some cases depend on the specific ion species—i.e., carbon or nitrogen—used for implantation. It should be noted, however, that in certain illustrative embodiments, the ion dose and energy level of the ion implantation process 230 may need to be further controlled so as to limit the ion penetration to a depth 203d that is no greater than the thickness of any subsequently formed metal silicide regions. The reason for limiting ion penetration depth is that the more deeply planted ions 230i may "deactivate" previously activated dopants in the drain and source regions 206 below the metal silicide. In this instance, since there are typically no further annealing steps performed following the ion implantation process 230, the "deactivated" dopants cannot be re-activated by putting them back on substitutional lattice sites. Accordingly, in at least some embodiments of the present disclosure, the parameters of the ion implantation process 230 may be further limited to comprise an ion dose between 1 and $1.25 \times 10^{15}$ atoms/cm$^2$ and an energy level between 1 keV and 3 keV, which may result in an ion implantation depth 203d in the range of approximately 10-20 nm.

FIG. 2b shows the illustrative semiconductor device 200 of FIG. 2a in a further manufacturing step. As shown in FIG. 2b, a refractory metal layer 211 may be formed above the PMOS transistor element 250 based on deposition process and parameters previously described with respect to FIG. 1b above. Also as previously described, in some illustrative embodiments the refractory metal layer 211 may substantially comprise nickel, whereas in other embodiments the refractory metal layer 211 may comprise nickel and platinum. Thereafter, a heat treatment process 221 may be performed so as to initiate a chemical reaction between the metal atoms in the refractory metal layer 211 and the silicon atoms in those areas of the source and drain regions 206 and the gate electrode 209 that are in contact with the refractory metal layer 211, thereby forming metal silicide regions, such as, for example, low resistivity nickel monosilicide regions (nickel silicide).

In certain illustrative embodiments the heat treatment process 221 may comprise a two-step process as previously described. Furthermore, the parameters used to perform the heat treatment process 221 may be controlled as required so as to ensure that the final thickness of the metal silicide is at least equal to, or even greater than, the depth 203d of the implanted ions 203i. For example, the refractory metal layer 211 may be deposited with a specified thickness, and the temperature and/or the duration of the heat treatment process 221 correspondingly adjusted so that substantially the entire refractory metal layer 211 is converted into a metal silicide, e.g., nickel silicide. Alternatively, the refractory metal layer 211 may be deposited with a thickness that is greater than that which may be required, and the degree of metal silicide generation may be controlled by the temperature and/or the duration of the heat treatment process 221.

FIG. 2c depicts the semiconductor device 200 of FIG. 2b in yet a further illustrative manufacturing stage, wherein metal silicide layers 212 having a thickness 212t have been formed in the upper portions/contact regions 212c of the drain and source regions 206, a metal silicide layer 213 having a thickness 213t has been formed in the upper portion/contact region 213c of the gate electrode 209, and any unreacted residual material of the refractory metal layer 211 has been stripped away. As shown in the illustrative embodiment depicted in FIG. 2c, the thickness 212t of the metal silicide layers 212 exceeds the depth 203d of ions 203i implanted during the ion implantation process 230, thereby substantially avoiding any dopant "deactivation" issues in the active area 202 below the contact regions 212c, as previously described. For example, in some illustrative embodiments of the present disclosure, the processing parameters used to form the metal silicide regions may be controlled as described above so that the thickness 212t of the metal silicide layer 212 may be in the range of 10-25 nm. In certain embodiments wherein the depth 203d of ion implantation ranges from 10-15 nm, the thickness 212t may be approximately 15-20 nm. Accordingly, depending on the depth 203d that ions 230i are implanted during the ion implantation process 230, other thicknesses 212t of the metal silicide layer 212 may also be appropriate.

Thereafter, processing may continue as illustrated in FIG. 1c-1f and described above, including the steps of forming a stressed material layer above the PMOS transistor device 250 so as to enhance device performance, and performing a subsequent UV curing step. Moreover, since the metal silicide layers 212, comprising, for example, nickel silicide, formed in the silicon-germanium material regions 203a may be substantially stabilized by the presence of implanted carbon and/or nitrogen ions 203i, the problems associated with material diffusion and agglomerated metal silicide regions—such as, for example, "punch through" defects of conductive contact elements—may also be reduced.

FIGS. 3a-3b depict yet another illustrative embodiment of the presently disclosed subject matter and will now be described.

FIG. 3a shows a schematic cross-sectional view of a semiconductor device 300, substantially corresponding to the manufacturing stage of the semiconductor device 100 illustrated in FIG. 1b and described above. As shown in FIG. 3a, a refractory metal layer 311, comprising, for example, nickel and/or a nickel alloy such as nickel-platinum and the like, may be formed above the PMOS transistor element 350, and thereafter exposed to a heat treatment process 321. During the heat treatment process 321, a chemical reaction may be initiated between the metal atoms in the refractory metal layer 311, e.g., nickel or nickel-platinum, and the silicon atoms in those areas of the source and drain regions 306 and the gate electrode 309 that are in direct contact with the refractory metal layer 311, thereby forming metal silicide regions, e.g., low-resistivity nickel monosilicide. The parameters used to perform the heat treatment process 321 may be controlled as required so as to generate a metal silicide layer 312 (see, FIG. 3b) in the silicon-germanium material regions 303a of the active area 302 having a minimum thickness that is at least equal to or greater than the depth of carbon and/or nitrogen atoms that may be implanted in the drain and source regions 306 during a later-performed ion implantation process 330 (see, FIG. 3b). For example, in some illustrative embodiments, the thickness 312t of the metal silicide metal silicide layer 312 (see, FIG. 3b) may range from 10-25 nm, whereas in certain embodiments the thickness 312t may be approximately 15-20 nm. Depending on the eventual depth 303d of ion implantation (see FIG. 3b), other thickness ranges may also be appropriate.

As previously described, the thickness of the metal silicide layer may be controlled by depositing the refractory metal layer 311 with a specified thickness, and thereafter the temperature and/or the duration of the heat treatment process 321 may be correspondingly adjusted so that substantially the entire refractory metal layer 311 is converted into metal silicide. In other illustrative embodiments, the thickness of the metal silicide layer may be controlled by depositing the refractory metal layer 311 with a thickness that is substantially greater than that which may be required, and thereafter the degree of metal silicide generation may be controlled by the temperature and/or the duration of the heat treatment process 321. Other thickness control methods may also be employed.

FIG. 3b depicts the illustrative semiconductor device 300 of FIG. 2a in a further manufacturing stage after completion of the heat treatment process 321, and after unreacted residual material of the refractory metal layer 311 has been stripped away by an etching process, as previously described. As shown in FIG. 3b, metal silicide layers 312 have been formed in the upper portion/contact regions 312c of the drain and source regions 306, and a metal silicide layer 313 has been formed in the upper portion/contact region 313c of the gate electrode 309. Additionally, an ion implantation process 330 may also be performed, wherein carbon and/or nitrogen ions may be implanted into the metal silicide layers 312—using a high ion dose and low energy level, as previously described with respect to the embodiment illustrated in FIG. 2a—so as to stabilize the microstructure, and to reduce the likelihood that material diffusion and/or metal silicide agglomeration may occur. In some illustrative embodiments, the ion dose and energy level used to perform the ion implantation process 330 may be adjusted so that the depth 303d of the implanted carbon and/or nitrogen atoms 330i is no greater than the thickness 312t of the nickel silicide layers 312 formed in the silicon-germanium material regions 303a of the drain and source regions 306. For example, in those illustrative embodiments wherein the thickness 312t of the metal silicide layers 312 is approximately 15-20 nm, the parameters of the ion implantation process 330 may be adjusted so that the depth 303d of ion implantation is in a range from 10-15 nm.

It should be noted, however, that in contrast to the embodiment illustrated by FIGS. 2a-2c and described above, the silicon-germanium material regions 303a of the embodiment illustrated in FIG. 3b may be more resistant to the penetration of the ions 330i, due to the presence of the metal silicide material of the metal silicide layers 312. Accordingly, the implantation parameters used to perform the ion implantation process 330—i.e., the ion dose, the energy level, or both— may be higher than those previous described for the embodiment illustrated by FIGS. 2a-2c, wherein the corresponding ion implantation process 230 is performed prior to forming the metal silicide layers 212. Therefore, the ion implantation process 330 may performed after the metal silicide layers 312 have been formed based on "higher" implantation parameters without creating an implantation depth 330d that may be greater than the thickness 312t, thereby substantially avoiding any dopant "deactivation" issues in the active area 303 below the contact regions 312c, as previously described. For example, in at least some embodiments of the present disclosure, such as when the thickness 312t of the metal silicide layers 312 is between 15 nm and 20 nm, the parameters of the ion implantation process 330 may be adjusted such that an ion dose between 1.5 and $2 \times 10^{15}$ atoms/cm$^2$ and an energy level in the range of 2-3 keV are used to implant carbon and/or nitrogen ions 330i to a depth 330d of approximately 12-15 nm, i.e., a depth that is less than or equal to the thickness 312t.

Thereafter, processing may continue as illustrated in FIG. 1c-1f and described above, wherein a stressed material layer may be formed above the PMOS transistor device 350 and a subsequent UV curing step is performed to enhance device performance. Furthermore, conductive contact elements may be formed to the contact regions 312c and/or 313c, and since the metal silicide layers 313 formed in the silicon-germanium material regions 303a may be substantially stabilized by the presence of implanted carbon and/or nitrogen ions 303i, the problems associated with material diffusion and agglomerated metal silicide regions—such as, for example, "punch through" defects of the conductive contact elements—may be significantly reduced.

As a result of the presently disclosed methods for forming metal silicide regions, the likelihood that defects such as contact "punch through" and the like may occur during device processing may be lessened, or even eliminated, as compared to metal silicide regions formed using prior art processes, such as the example discussed in the background section of this application. More specifically, a decrease in product yield attributable to contact "punch through" defects may be significantly reduced when employing methods in accordance with the subject defined by the present disclosure, particularly in semiconductor devices utilizing integration schemes based upon technology nodes less than 45 nm, such as 32 nm and even smaller.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing an ion implantation process to implant at least one of carbon and nitrogen ions into a contact area of a PMOS transistor element, said contact area comprising germanium;
    after performing said ion implantation process, forming a metal silicide layer in said contact area;
    forming a stressed dielectric material layer comprising a first tensile stress level above said PMOS transistor element;
    increasing a stress level of said stressed dielectric material layer from said first tensile stress level to a second tensile stress level greater than said first tensile stress level; and
    after forming said stressed dielectric material layer above said PMOS transistor element, exposing said metal silicide layer to ultraviolet light.

2. The method of claim 1, wherein forming said metal silicide layer comprises forming said metal silicide layer with a thickness that is greater than a depth of said ions implanted in said active area during said ion implantation process.

3. The method of claim 1, wherein forming said metal silicide layer in said contact area comprises forming said metal silicide layer in at least one of a source region and a drain region of said PMOS transistor element.

4. The method of claim 3, wherein said metal silicide layer is formed after performing an activation anneal to activate dopants implanted in said at least one of said source region and said drain region of said PMOS transistor element.

5. The method of claim 4, wherein forming said metal silicide layer comprises forming said metal silicide layer with a thickness that is greater than a depth of said ions implanted in said active area during said ion implantation process.

6. The method of claim 1, wherein increasing a stress level of said stressed dielectric material layer from said first tensile stress level to said second tensile stress level comprises exposing said stressed dielectric material layer to said ultraviolet light.

7. The method of claim 1, further comprising forming a conductive contact element to said metal silicide layer after exposing said metal silicide layer to said ultraviolet light.

8. The method of claim 7, wherein forming said conductive contact element to said metal silicide layer comprises using said stressed dielectric material layer as an etch stop layer to form a via opening during an etch process adapted to expose said metal silicide layer.

9. A method, comprising:
    performing an ion implantation process to implant carbon ions into at least one of a source region and a drain region of a PMOS transistor element, said at least one of said source and drain regions comprising germanium;
    after performing said ion implantation process, forming a metal silicide layer in said at least one of said source region and said drain region of a PMOS transistor element, wherein a thickness of said metal silicide layer is greater than an implantation depth of said implanted carbon ions;
    forming a stressed dielectric material layer comprising a first tensile stress level above said PMOS transistor element; and
    after forming said metal silicide, exposing said PMOS transistor element to ultraviolet light to increase a stress level of said stressed dielectric material layer from said first tensile stress level to a second tensile stress level greater than said first tensile stress.

10. The method of claim 9, further comprising performing an activation anneal to activate dopants implanted in said at least one of said source region and said drain region of said PMOS transistor element prior to forming said metal silicide layer.

11. The method of claim 9, further comprising forming a conductive contact element connecting to said metal silicide layer after increasing said stress level of said stressed dielectric material layer.

12. The method of claim 9, wherein forming said conductive contact element to said metal silicide layer comprises using said stressed dielectric material layer as an etch stop layer to form a via opening during an etch process that is adapted to expose said metal silicide layer.

13. A method, comprising: performing an ion implantation process to implant nitrogen ions into at least one of a source region and a drain region of a PMOS transistor element, said at least one of said source and drain regions comprising germanium;
    after performing said ion implantation process, forming a metal silicide layer in said at least one of said source region and said drain region of a PMOS transistor element, wherein a thickness of said metal silicide layer is greater than an implantation depth of said implanted nitrogen ions;
    forming a stressed dielectric material layer comprising a first tensile stress level above said PMOS transistor element; and
    after forming said metal silicide, exposing said PMOS transistor element to ultraviolet light to increase a stress level of said stressed dielectric material layer from said first tensile stress level to a second tensile stress level greater than said first tensile stress.

14. The method of claim 13, further comprising performing an activation anneal to activate dopants implanted in said at least one of said source region and said drain region of said PMOS transistor element prior to forming said metal silicide layer.

15. The method of claim 13, further comprising forming a stressed dielectric material layer comprising a first tensile stress level above said PMOS transistor element and thereafter exposing said PMOS transistor element to said ultraviolet light to increase a stress level of said stressed dielectric material layer from said first tensile stress level to a second tensile stress level greater than said first tensile stress.

16. The method of claim 15, further comprising forming a conductive contact element connecting to said metal silicide layer after increasing said stress level of said stressed dielectric material layer.

17. The method of claim 15, wherein forming said conductive contact element to said metal silicide layer comprises using said stressed dielectric material layer as an etch stop layer to form a via opening during an etch process that is adapted to expose said metal silicide layer.

\* \* \* \* \*